(12) United States Patent
Jung et al.

(10) Patent No.: US 10,103,117 B2
(45) Date of Patent: Oct. 16, 2018

(54) METHOD OF MANUFACTURING FAN-OUT TYPE WAFER LEVEL PACKAGE

(71) Applicant: SFA Semicon Co., Ltd., Cheonan-si, Chungcheongnam-do (KR)

(72) Inventors: Hyun Hak Jung, Cheonan-si (KR); Eun Dong Kim, Seoul (KR); Jong Won Lee, Seoul (KR); Jai Kyoung Choi, Busan (KR); Byeong Ho Jeong, Hwaseong-si (KR)

(73) Assignee: SFA Semicon Co., Ltd. (KR)

( * ) Notice: Subject to any disclaimer, the term of this patent is extended or adjusted under 35 U.S.C. 154(b) by 0 days.

(21) Appl. No.: 15/246,432

(22) Filed: Aug. 24, 2016

(65) Prior Publication Data

US 2017/0062368 A1 Mar. 2, 2017

(30) Foreign Application Priority Data

Aug. 24, 2015 (KR) .......................... 10-2015-0118794

(51) Int. Cl.
| | |
|---|---|
| *H01L 21/00* | (2006.01) |
| *H01L 23/00* | (2006.01) |
| *H01L 21/56* | (2006.01) |
| *H01L 21/78* | (2006.01) |

(52) U.S. Cl.
CPC ............ *H01L 24/11* (2013.01); *H01L 21/563* (2013.01); *H01L 21/78* (2013.01); *H01L 24/03* (2013.01); *H01L 24/06* (2013.01); *H01L 24/09* (2013.01); *H01L 24/19* (2013.01); *H01L 2224/0401* (2013.01); *H01L 2224/05082* (2013.01)

(58) Field of Classification Search
None
See application file for complete search history.

(56) References Cited

U.S. PATENT DOCUMENTS

| | | | |
|---|---|---|---|
| 7,666,709 B1 | 2/2010 | Lin et al. | |
| 7,977,783 B1 * | 7/2011 | Park | ........................ H01L 24/11 257/692 |
| 8,815,642 B2 | 8/2014 | West et al. | |
| 8,877,523 B2 | 11/2014 | Leal | |
| 9,666,500 B2 * | 5/2017 | Lin | ..................... H01L 23/3114 |
| 2009/0166892 A1 | 7/2009 | Lee | |
| 2011/0156250 A1 | 6/2011 | Goh et al. | |

(Continued)

FOREIGN PATENT DOCUMENTS

| | | |
|---|---|---|
| JP | 62007878 A | 1/1987 |
| KR | 100895820 B1 | 5/2009 |
| KR | 20140034491 A | 3/2014 |

*Primary Examiner* — David E Graybill
(74) *Attorney, Agent, or Firm* — Renaissance IP Law Group LLP

(57) ABSTRACT

Provided is a method of manufacturing a fan-out type wafer level package. The method includes forming a fiducial mark pattern on a frame, attaching a semiconductor die to the frame with respect to the fiducial mark pattern, encapsulating the semiconductor die with a passivation layer, for reconstituting the semiconductor die as a wafer level, and sequentially forming a metal seed layer, a redistribution layer, an under bump metal (UBM) seed layer, an UBM layer, and a solder ball on a bonding pad of the semiconductor die upward exposed by an opening region of the passivation layer to finish a fan-out type wafer level package.

3 Claims, 10 Drawing Sheets

(56) References Cited

U.S. PATENT DOCUMENTS

2012/0139100 A1\* 6/2012 Fillmore ............... H01L 23/544
            257/734
2012/0329212 A1  12/2012 Leal
2013/0334712 A1\* 12/2013 Meyer-Berg .......... H01L 21/561
            257/783
2014/0070408 A1   3/2014 So et al.
2017/0062368 A1\*  3/2017 Jung ....................... H01L 24/11

\* cited by examiner (A)
(B)
(C)

… (1) …

METHOD OF MANUFACTURING FAN-OUT TYPE WAFER LEVEL PACKAGE

CROSS-REFERENCE TO RELATED APPLICATIONS

This application claims priority under 35 U.S.C. § 119 to Korean Patent Application No. 10-2015-0118794, filed on Aug. 24, 2015, the disclosure of which is incorporated herein by reference in its entirety.

TECHNICAL FIELD

The present invention relates to a method of manufacturing a fan-out type wafer level package, and more particularly, to a method of manufacturing a fan-out type wafer level package, which includes a die attach process of attaching a plurality of semiconductor dies, separated from a wafer, to a frame.

BACKGROUND

Recently, with the advancement of high-tech electronic devices, semiconductor package technology relevant thereto is using various manufacturing methods. As products such as notebook computers, mobile equipment, wearable devices, etc. are further thinned and lightened, semiconductor packaging technology for miniaturizing, lightening, and thinning a size of a semiconductor chip applied to the devices is becoming an increasingly important issue, and a method of reducing the manufacturing cost is attracting much attention.

Particularly, a ball grid array (BGA) package is mounted on a printed circuit board (PCB), a molding process is performed for the BGA package, and a solder ball is attached to a bottom of the BGA package. However, a related art semiconductor packaging method using a PCB has a limitation in processing a semiconductor to a thin thickness.

In order to solve a limitation of the BGA package, a wafer level package (WLP) process has been developed.

The WLP process may be categorized into a fan-in WLP process and a fan-out WLP process.

Since a semiconductor package manufactured by the fan-in WLP process cannot accommodate an interval between solder balls recommended by joint electron device engineering council (JEDEC), the fan-out WLP process has been developed.

The fan-out WLP process is largely categorized into a die attach process of attaching a plurality of semiconductor dies to a frame at certain intervals, a redistribution process of forming a redistribution layer on each of the semiconductor dies, and a bumping process of forming a solder ball on the redistribution layer.

In the redistribution process and the bumping process, since a redistribution layer and a solder ball are formed at accurate positions, a precise process is necessary.

However, when a plurality of semiconductor dies 22 and 24 are not attached to accurate positions in the die attach process, as illustrated in FIG. 1, a semiconductor chip 22 and a semiconductor chip 24 are disposed on a frame 10 at uncertain intervals, and for this reason, an error occurs in a subsequent process which includes the redistribution process and the bumping process requiring a precise process. The error becomes a main cause of reducing a bumping yield.

SUMMARY

Accordingly, the present invention provides a method of manufacturing a fan-out type wafer level package, which attaches (or arranges) a plurality of semiconductor dies to accurate positions of a frame, thereby enhancing a bumping yield.

In one general aspect, a method of manufacturing a fan-out type wafer level package includes: forming a fiducial mark pattern on a frame; attaching a semiconductor die to the frame with respect to the fiducial mark pattern; encapsulating the semiconductor die with a passivation layer, for reconstituting the semiconductor die as a wafer level; and sequentially forming a metal seed layer, a redistribution layer, an under bump metal (UBM) seed layer, an UBM layer, and a solder ball on a bonding pad of the semiconductor die upward exposed by an opening region of the passivation layer to finish a fan-out type wafer level package.

In another general aspect, a method of manufacturing a fan-out type wafer level package includes: forming a fiducial mark pattern on a frame; attaching a semiconductor die to the frame with respect to the fiducial mark pattern; encapsulating the semiconductor die with an epoxy molding compound, for reconstituting the semiconductor die as a wafer level; removing the frame where the fiducial mark pattern is formed, for isolating the semiconductor die, reconstituted as the wafer level by the epoxy molding compound, from the frame; and sequentially forming a metal seed layer, a redistribution layer, an under bump metal (UBM) seed layer, an UBM layer, and a solder ball on a bonding pad of the semiconductor die upward exposed by an opening region of the epoxy molding compound to finish a fan-out type wafer level package.

Other features and aspects will be apparent from the following detailed description, the drawings, and the claims.

DETAILED DESCRIPTION OF EMBODIMENTS

Hereinafter, embodiments of the present invention will be described in detail with reference to the accompanying drawings.

Figure 1:
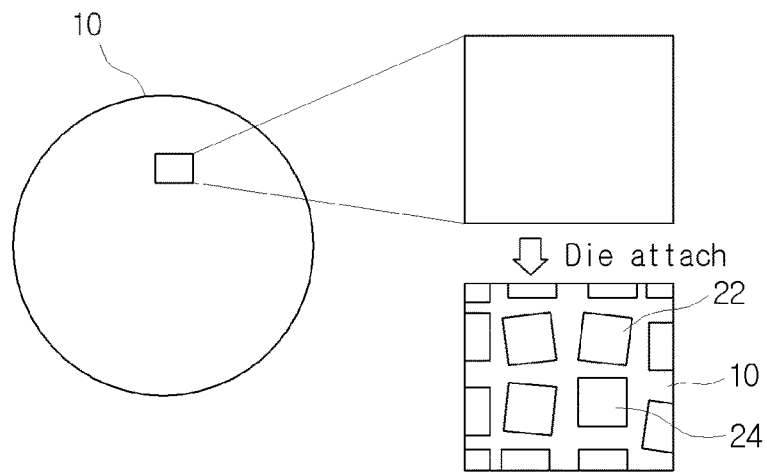
FIG. 1 is a diagram illustrating a plurality of semiconductor dies which are inaccurately attached to a frame in a related art WLP process.
Figure 2:
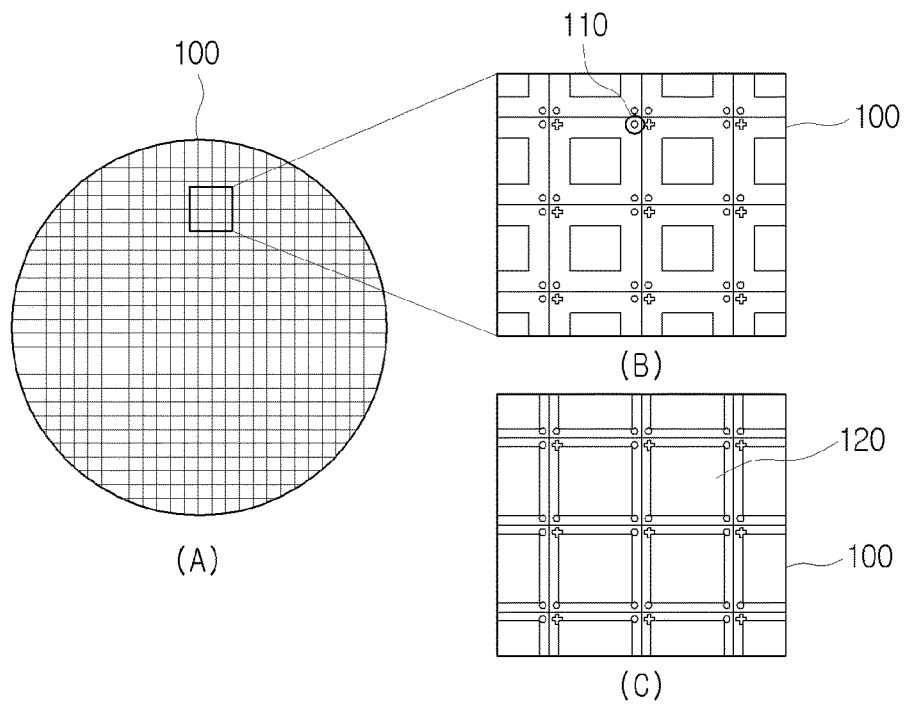
FIG. 2 is a plan view illustrating an arrangement state of a plurality of semiconductor dies which are attached to a frame applied to a die attach process for manufacturing a wafer level package according to an embodiment of the present invention.

FIG. 2 is a plan view illustrating an arrangement state of a plurality of semiconductor dies which are attached to a frame applied to a die attach process for manufacturing a wafer level package according to an embodiment of the present invention.

As illustrated in FIG. 2 (A), a circular frame 100 may be used for rearranging (or reconstituting) a plurality of semiconductor dies 120 as a wafer level. Here, the frame 100 may be a carrier, a wafer, glass, or the like. However, the kind of the frame 100 according to an embodiment of the present invention is not limited to a carrier, a wafer, or glass. In other embodiments, a supporting frame capable of being used for reconstituting the semiconductor dies 120 as a wafer level (or form) may be used without limitation in kind.

According to an embodiment of the present invention, in order to rearrange (or reconstitute) the plurality of semiconductor dies 120 on the frame 100 at uniform intervals, as illustrated in FIG. 2 (B), the present invention has a difference with the related art in that a plurality of fiducial mark patterns 110 are formed on the frame 100.

Each of the fiducial mark patterns 110 may act as a reference position for rearranging (or reconstituting) the semiconductor dies 120 on the frame 100 at uniform intervals. That is, each of the fiducial mark patterns 110 may be used as a reference position for a chip mounter (not shown) attaching the semiconductor dies 120 to accurate positions of the frame 100.

For example, when the chip mounter recognizes the fiducial mark patterns 110 formed on the frame 100 before the semiconductor dies 120 are attached to the frame 100, the chip mounter may calculate positions, to which the semiconductor dies 120 are to be respectively attached, from centers of the recognized fiducial mark patterns 110 and may attach the semiconductor dies 120 to the calculated positions.

As described above, as illustrated in FIG. 2 (C), the attached semiconductor dies 120 may be arranged on the frame 100 at uniform intervals, and in a bumping process subsequent to such a die attach process, a bumping yield is improved.

Hereinafter, a die attach process of attaching a semiconductor die to a frame where a fiducial mark pattern is formed in a fan-out WLP process will be described in more detail.

Figure 3A:
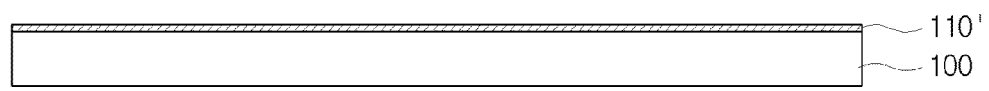
FIGS. 3A to 3C are cross-sectional views for describing a die attach process in a fan-out WLP process according to an embodiment of the present invention.
Figure 3B:
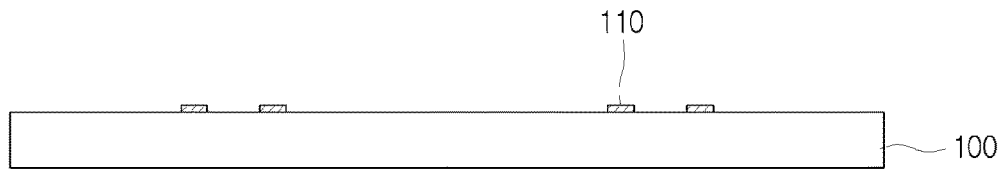
Figure 3C:
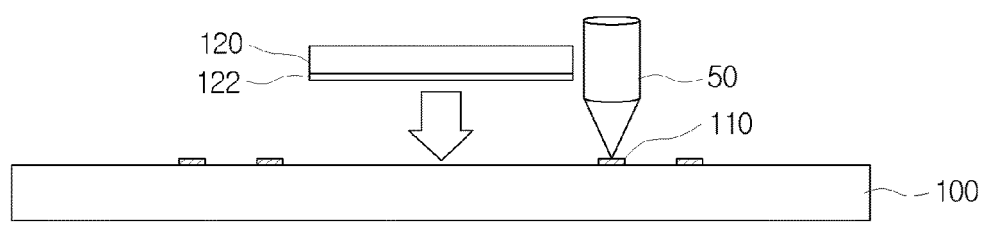

FIGS. 3A to 3C are cross-sectional views for describing a die attach process in a fan-out WLP process according to an embodiment of the present invention.

Referring to FIG. 3A, first, a process of forming a seed layer 110' including a first material all over a frame 100 may be performed. Here, the first material may be polyimide (PI) or photoresist (PR) which is a photosensitive film, and the frame 100 may be a carrier, a wafer, glass, or the like. A method of forming the seed layer 110' including PR or PI may use a coating process or a chemical vapor deposition (CVD) process.

Subsequently, referring to FIG. 3B, a process of patterning the seed layer 110' formed on the frame 110 to form, on the frame 100, a fiducial mark pattern 110 for recognizing a position to which the semiconductor die 120 is to be attached may be performed. Here, a method of patterning the seed layer 110' may use a photolithography process which includes an exposure process and a development process.

Subsequently, referring to FIG. 3C, a chip mounter (not shown) may recognize a position of the fiducial mark pattern 110 by using a mark recognition device 50 and may attach the semiconductor die 120 to the frame 100 with respect to the recognized position of the fiducial mark pattern 110 to rearrange (or reconstitute) the semiconductor die 120 on the frame 100. In this case, a die attach film 122 may be formed on one surface of the semiconductor die 120, and the semiconductor die 120 may be attached to the frame 100 by using the die attach film 122.

FIGS. 4A to 4E are cross-sectional views for describing a die attach process in a fan-out WLP process according to another embodiment of the present invention.

Figure 4A:
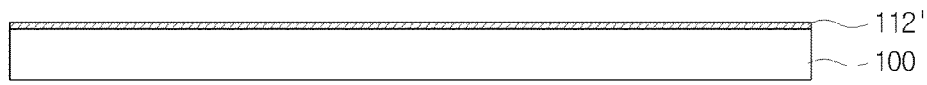
FIGS. 4A to 4E are cross-sectional views for describing a die attach process in a fan-out WLP process according to another embodiment of the present invention.

Referring to FIG. 4A, a process of forming a seed layer 112' including a second material all over a frame 100 may be performed. Here, the second material may be a metal material. A method of forming the seed layer 112' including the metal material may use a CVD process or a physical vapor deposition (PVD) process such as a vacuum deposition process, a sputtering process, or an ion plating process.

Figure 4B:

Subsequently, referring to FIG. 4B, a process of forming a photoresist pattern 114 covering a partial region of the seed layer 112' including the metal material may be performed. In detail, a photoresist may be first formed all over the seed layer 112'. Here, the photoresist may be a negative photoresist. Subsequently, the photoresist pattern 114 may be formed by removing a region other than the partial region of the photoresist. In this case, a method of removing the other region of the photoresist may use a photolithography process which includes an exposure process and a development process.

Figure 4C:

Subsequently, referring to FIG. 4C, a fiducial mark pattern 112 including the metal material may be formed by removing the seed layer 112' with the photoresist pattern as an etch stop layer. Here, a method of removing the seed layer 112' may use a dry or wet etching process.

Figure 4D:

Subsequently, referring to FIG. 4D, the photoresist pattern 114 which is formed on the frame 100 and remains on the seed layer 112' may be removed. Therefore, the fiducial mark pattern 112 including the metal material may be formed on the frame 100.

Figure 4E:
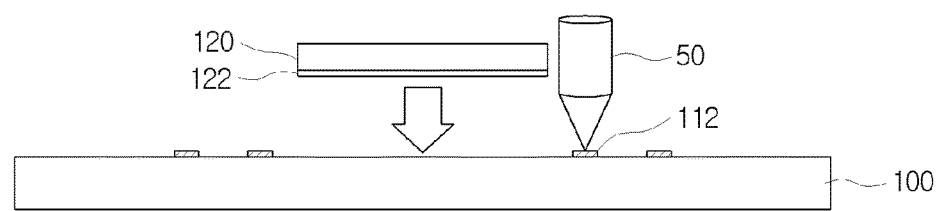

Subsequently, referring to FIG. 4E, a chip mounter (not shown) may recognize a position of the fiducial mark pattern 112 by using a mark recognition device 50 and may attach the semiconductor die 120 to the frame 100 with respect to the recognized position of the fiducial mark pattern 112 to rearrange (or reconstitute) the semiconductor die 120 on the frame 100. In this case, a die attach film 122 may be formed on one surface of the semiconductor die 120, and the semiconductor die 120 may be attached to the frame 100 by using the die attach film 122.

FIGS. 5A to 5D are cross-sectional views for describing a die attach process in a fan-out WLP process according to another embodiment of the present invention.

Figure 5A:
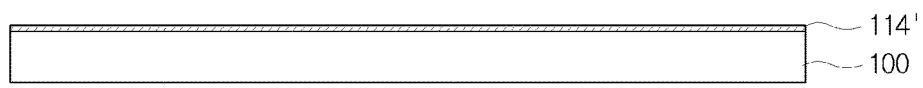
FIGS. 5A to 5D are cross-sectional views for describing a die attach process in a fan-out WLP process according to another embodiment of the present invention.

Referring to FIG. 5A, a process of forming a metal seed layer 114' all over a frame 100 may be performed. A method of forming the metal seed layer 114' may use a CVD process or a PVD process such as a vacuum deposition process, a sputtering process, or an ion plating process. A material of the metal seed layer 114' may be a copper (Cu) or an equivalent material thereof.

Figure 5B:
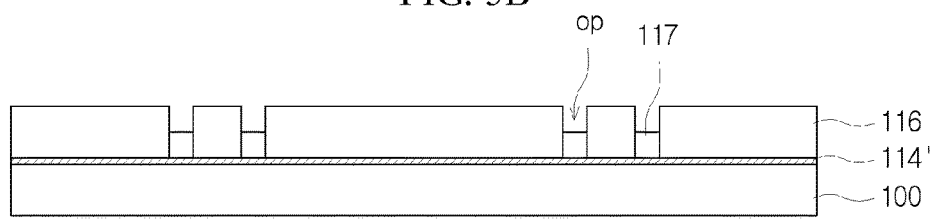

Referring to FIG. 5B, a process of forming a second metal pattern 117 on the metal seed layer 114' may be performed. In detail, a photoresist 116 may be formed all over the metal seed layer 114'. Subsequently, an opening OP passing through the photoresist 116 may be formed by using a photolithography process which includes an exposure process and a development process. Subsequently, a top metal pattern 117 may be filled into the opening OP by using the metal seed layer 114' as a seed according to a plating process such as an electroplating process. In another embodiment, the top metal pattern 117 may be filled into the opening OP in an electroless plating process. In this case, the metal seed layer 114' may be omitted. Therefore, the top metal pattern 117 may be formed on the metal seed layer 114' which is upward exposed by the opening OP. Here, a material of the top metal pattern 117 may be Cr/Cr—Cu/Cu, Ti—W/Cu, Al/Ni/Cu, or an equivalent material thereof. Subsequently, the photoresist 116 including the opening OP may be removed by a dry or wet etching process.

Figure 5C:

Subsequently, referring to FIG. 5C, the metal seed layer 114' which is upward exposed by removing the photoresist 116 including the opening OP may be removed by using the top metal pattern 117 as an etch stop layer. Therefore, a fiducial mark pattern 114 and 117 having a structure where a bottom metal pattern 114 generated from the metal seed layer 114' and the top metal pattern 117 are sequentially stacked may be formed.

Figure 5D:
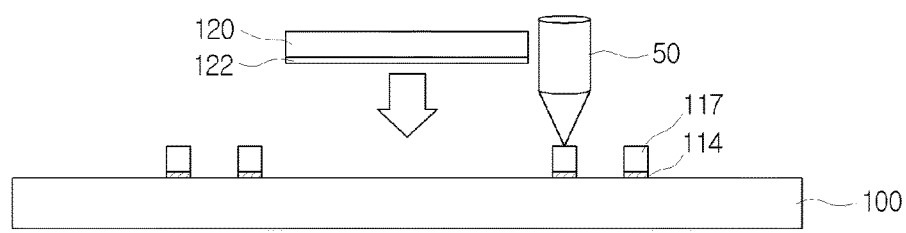

Subsequently, referring to FIG. 5D, a process of attaching a semiconductor die 120 to the frame 100 to rearrange (or reconstitute) the semiconductor die 120 on the frame 100 may be performed by using the fiducial mark pattern 114 and 117 as a reference position in the same method as the method described above with reference to FIG. 3C or 4E.

Figure 6A:
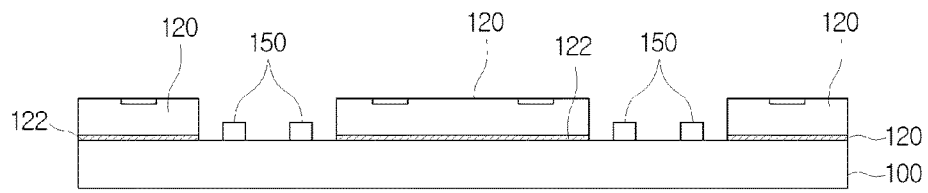
FIGS. 6A to 6P are cross-sectional views illustrating a method of manufacturing a fan-out type wafer level package performed on a frame where a fiducial mark pattern according to an embodiment of the present invention is formed.
Figure 6B:
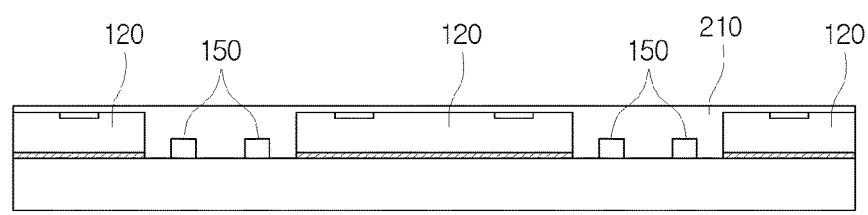
Figure 6C:
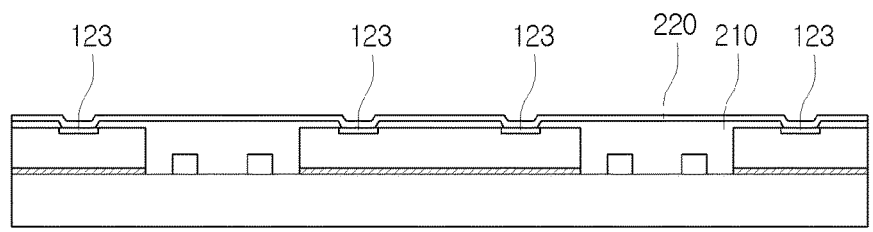
Figure 6D:
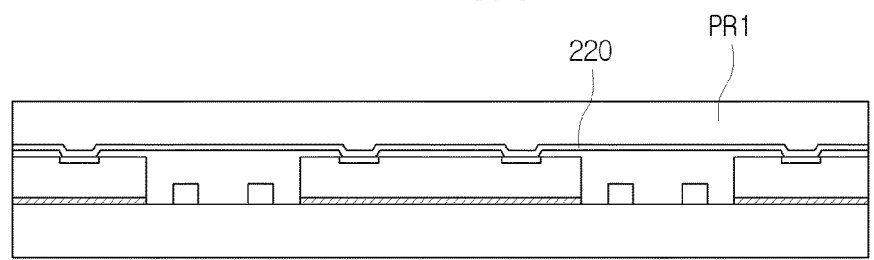
Figure 6E:
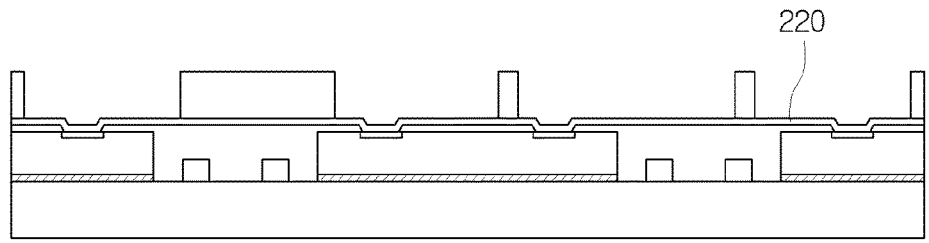
Figure 6F:
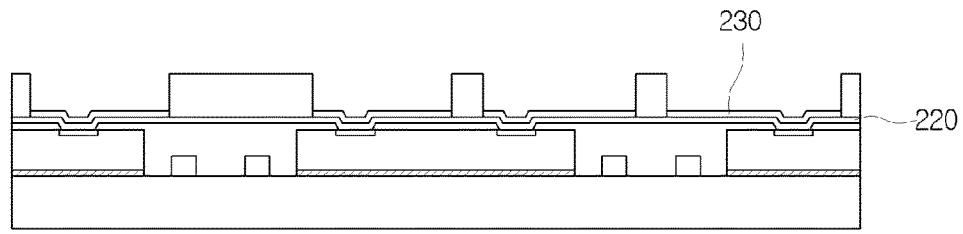
Figure 6G:
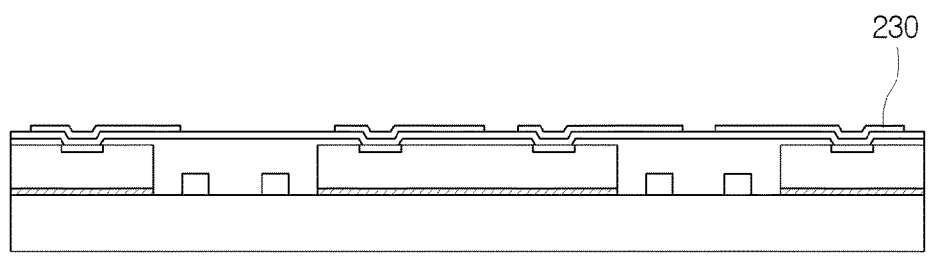
Figure 6H:
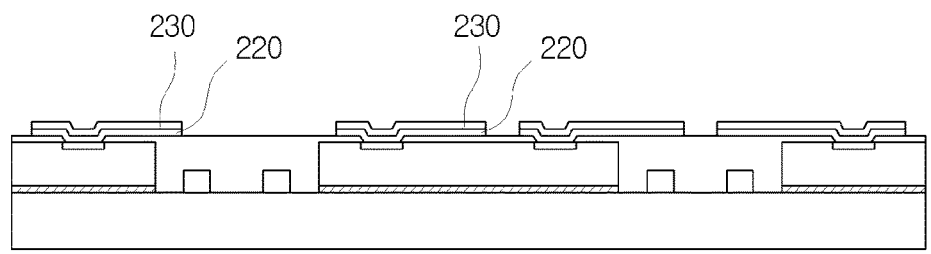
Figure 6I:
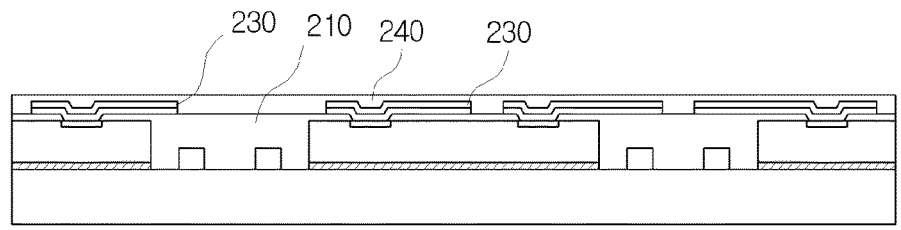
Figure 6J:
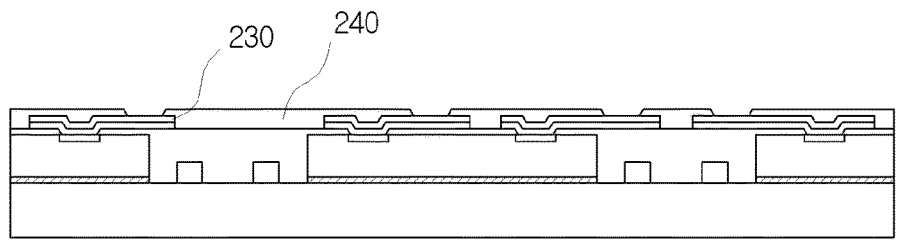
Figure 6K:
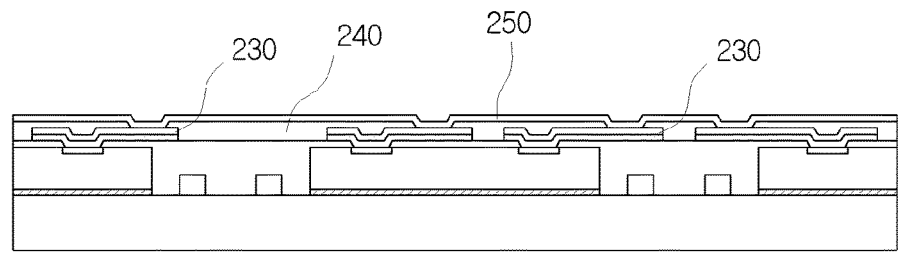
Figure 6L:
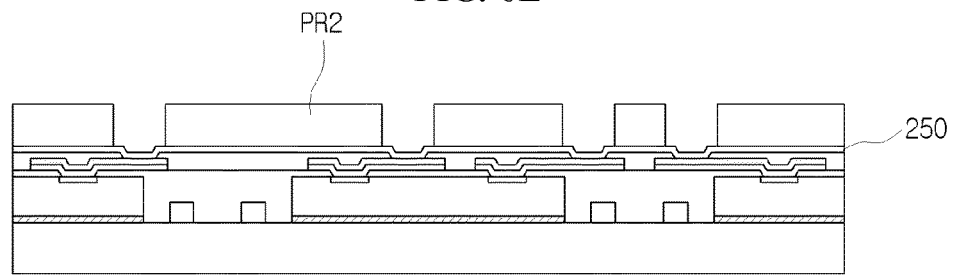
Figure 6M:
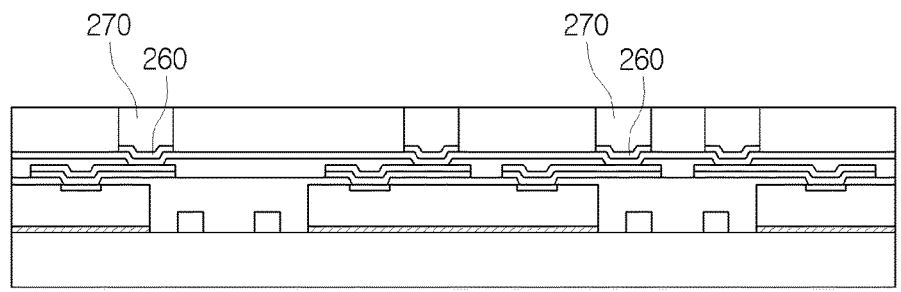
Figure 6N:
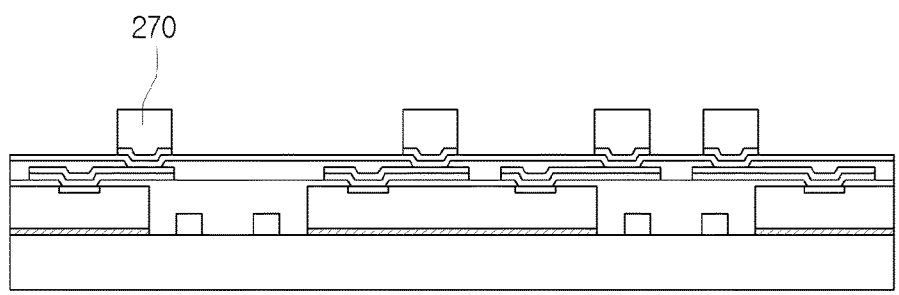
Figure 6O:
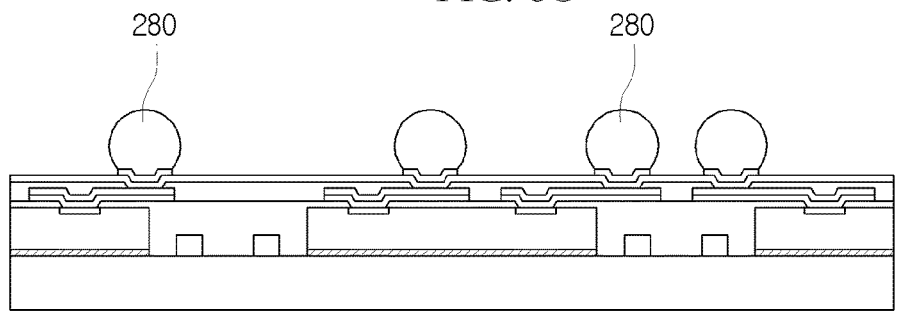
Figure 6P:
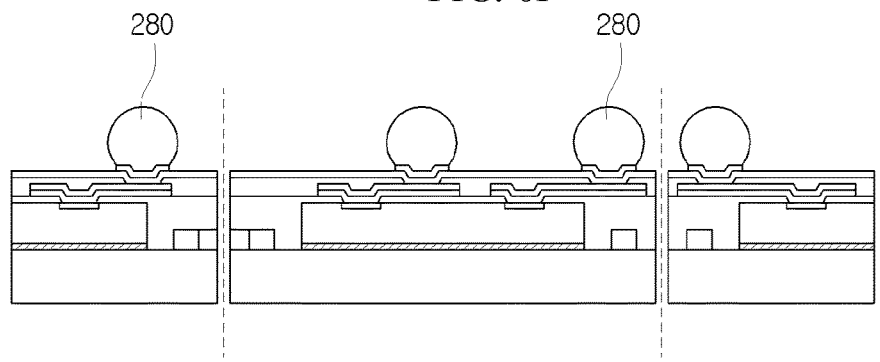

FIGS. 6A to 6P are cross-sectional views illustrating a method of manufacturing a fan-out type wafer level package performed on a frame where a fiducial mark pattern according to an embodiment of the present invention is formed.

Referring to FIG. 6A, in order to rearrange (or reconstitute) a plurality of semiconductor dies 120 at accurate positions of a frame 100, a process of attaching the semiconductor dies 120 to the frame 100 where a fiducial mark pattern 150 described above with reference to FIGS. 3A to 5D is formed may be first performed.

The description of FIGS. 3A to 5D may be applied to the die attach process. In the present embodiment, the fiducial mark pattern 150 is assumed as including PR or PI described above with reference to FIG. 3B. However, as illustrated in FIG. 4D, the fiducial mark pattern 150 may be formed of one metal material, or as illustrated in FIG. 5C, may be formed in a type where two different metal materials are stacked.

Subsequently, referring to FIG. 6B, a process of encapsulating the semiconductor dies 120 and a plurality of the fiducial mark patterns 150 with a first passivation layer 210 may be performed. Here, an encapsulation method may use a coating process. A material of the first passivation layer 210 may be any one material selected from among polyimide (PI), benzo cyclo butene (BCB), poly benz oxazole (PBO), bismaleimideTriazine (BT), phenolic resin, epoxy, silicon, $SiO_2$, $Si_3N_4$, and an equivalent material thereof, but is not limited thereto.

Subsequently, referring to FIG. 6C, an opening region which upward exposes a bonding pad 123 of each of the semiconductor dies 120 may be formed in the first passivation layer 210, and a metal seed layer 220 may be formed all over the bonding pad 123 exposed by the opening region of the first passivation layer 210. Here, a method of forming the opening region in the first passivation layer 210 may use a photolithography process which includes an exposure process and a development process. Also, a method of forming the metal seed layer 220 may use a PVD process or a CVD process.

Subsequently, referring to FIG. 6D, a process of forming a first photoresist PR1 on the metal seed layer 220 may be performed.

Subsequently, referring to FIG. 6E, a process of forming an opening region in the first photoresist PR1 may be performed by using the photolithography process which includes the exposure process and the development process.

Subsequently, referring to FIG. 6F, a process of forming a redistribution layer (RDL) 230 on the metal seed layer 220 exposed by the opening region of the first photoresist PR1 may be performed. Here, a method of forming the RDL 230 may use an electroplating process which uses the metal seed layer 220 as a seed. Alternatively, the method of forming the RDL 230 may use an electroless plating process, and in this case, the metal seed layer 220 may be omitted.

Subsequently, referring to FIG. 6G, a process of removing the first photoresist PR1 may be performed. Here, a method of removing the first photoresist PR1 may use a dry or wet etching process.

Subsequently, referring to FIG. 6H, the metal seed layer 220 which is upward exposed by removing the first photoresist PR1 may be removed by using the RDL 230 as an etch stop layer. Here, a method of removing the metal seed layer 220 may use a dry or wet etching process.

Subsequently, referring to FIG. 6I, a process of forming a second passivation layer 240 on the RDL 230 and the first passivation layer 210 which is upward exposed by removing the metal seed layer 230 may be performed. A material of the second passivation layer 240 may be any one material selected from among polyimide (PI), benzo cyclo butene (BCB), poly benz oxazole (PBO), bismaleimideTriazine (BT), phenolic resin, epoxy, silicon, $SiO_2$, $Si_3N_4$, and an equivalent material thereof, but is not limited thereto.

Subsequently, referring to FIG. 6J, a process of forming an opening region, upward exposing a partial region of the RDL 230, in the second passivation layer 240 may be performed. Here, a method of forming the opening region in the second passivation layer 240 may use the photolithography process which includes the exposure process and the development process.

Subsequently, referring to FIG. 6K, a process of forming an under bump metal (UBM) seed layer 250 in a partial region of the RDL 230 which is upward exposed by the opening region of the second passivation layer 240 may be performed. In forming the UBM seed layer 250 through an electroplating process, a path through which a current flows may be provided. A material of the UBM seed layer 250 may be Cu or an equivalent material thereof.

Subsequently, referring to FIG. 6L, a process of forming a second photoresist PR2, including an opening region which upward exposes a partial region of the UBM seed layer 250, on the UBM seed layer 250 may be performed. Here, a method of forming the second photoresist PR2 including the opening region may use the photolithography process which includes the exposure process and the development process.

Subsequently, referring to FIG. 6M, a process of sequentially forming a UBM layer 260 and a bumping material 270 in the opening region of the second photoresist PR2 may be performed by using a plating process.

Subsequently, referring to FIG. 6N, a subsequent process of removing the UBM seed layer 250 which is upward exposed by removing the second photoresist PR2 may be performed after the second photoresist PR2 is removed.

Subsequently, referring to FIG. 6O, a process of forming a circular solder ball 280 from the bumping material 270 formed on the UBM layer 260 may be performed by using a reflow process. Therefore, a wafer level package may be finished. In the method of manufacturing a wafer level package according to an embodiment of the present invention, a method of forming the solder ball 280 with a photoresist is described, but the present invention is not limited thereto. In other embodiments, the solder ball 280 may be formed by using a copper pillar solder bump (CPB)

process of forming a pillar-shaped bump, a ball drop process using a ball drop stencil, or a screen printing process.

Subsequently, referring to FIG. 6P, a singulation process of isolating the finished wafer level package into a plurality of semiconductor packages along a dicing line 290 may be performed.

FIGS. 7A to 7E are cross-sectional views illustrating a method of manufacturing a fan-out type wafer level package performed on a frame where a fiducial mark pattern according to an embodiment of the present invention is formed.

Figure 7A:
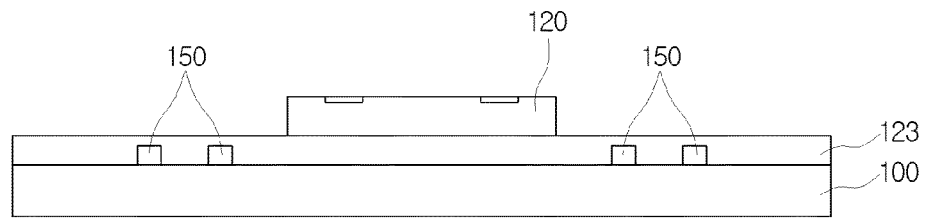
FIGS. 7A to 7E are cross-sectional views illustrating a method of manufacturing a fan-out type wafer level package performed on a frame where a fiducial mark pattern according to an embodiment of the present invention is formed.

Referring to FIG. 7A, a frame 100 where a fiducial mark pattern 150 is formed may be provided, and a process of coating a die attach film 123 on the frame 100 to cover the fiducial mark pattern 150 and then attaching a plurality of semiconductor dies 120 to the frame 100 by using the die attach film 123 may be performed.

The die attach film 123 may use a thermosetting release film or a photocurable film.

The thermosetting release film may maintain viscosity having no flowability and viscosity enabling the fiducial mark pattern 150 to pass through the thermosetting release film before being cured. The thermosetting release film may use a thermally sensitive tape whose an adhesion is minimized after being cured by heat.

The photocurable film may be a photocurable film that reacts on a specific wavelength range such as ultraviolet (UV). The photocurable film may be a film where when the film is exposed by light having the specific wavelength range, a glue layer of the film is UV-cured, and thus, an adhesion is minimized.

In addition to the thermally sensitive tape, the thermosetting release film is not limited in kind. For example, the thermosetting release film may use a film that maintains an adhesion at an initial attachment stage, but when the thermosetting release film is exposed is heated at a specific heating temperature or is exposed to light reaction, has a feature where the adhesion is lost and thus the thermosetting release film is simply striped.

Figure 7B:
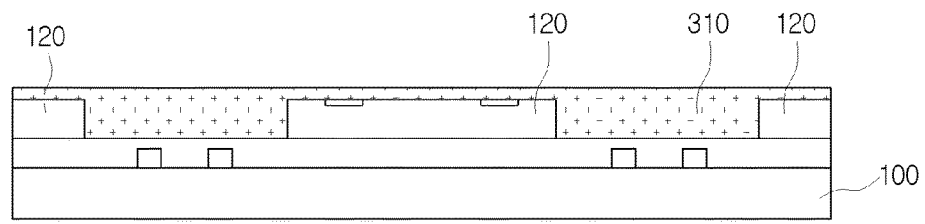

Subsequently, referring to FIG. 7B, a process of encapsulating the semiconductor dies 120 with an epoxy molding compound (EMC) 310 may be performed. Here, since the encapsulation process according to another embodiment encapsulates the semiconductor dies 120 with the EMC 310, the encapsulation process according to another embodiment has a difference with the embodiment of FIGS. 6A to 6P where the semiconductor dies 120 are encapsulated by the first passivation layer 210.

Figure 7C:
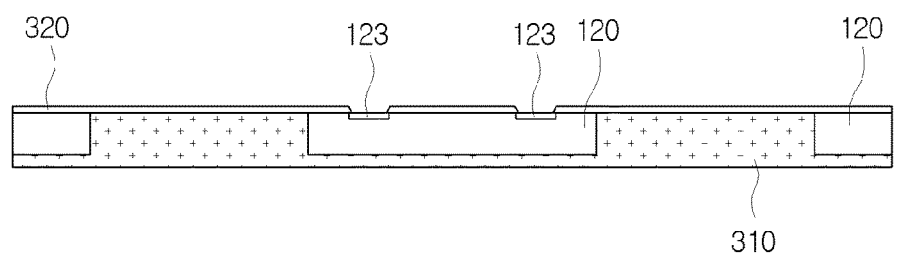

Subsequently, referring to FIG. 7C, a process of sequentially removing the frame 100 and the die attach film 123 may be performed. Here, a method of removing the frame 100 may use a back grinding process using a back grinding device. A method of removing the die attach film 123 may remove the die attach film 123 by using a heating process of heating the die attach film 123 at a specific heating temperature. At this time, as the die attach film 123 is removed, the fiducial mark pattern 150 may be removed. In the embodiment of FIGS. 6A to 6P, a semiconductor package including the fiducial mark pattern 150 may be manufactured, but in the embodiment of FIG. 7, a semiconductor package where the fiducial mark pattern 150 is not formed may be manufactured. That is, the embodiment of FIG. 7 has a difference with the embodiment of FIGS. 6A to 6P.

Figure 7D:
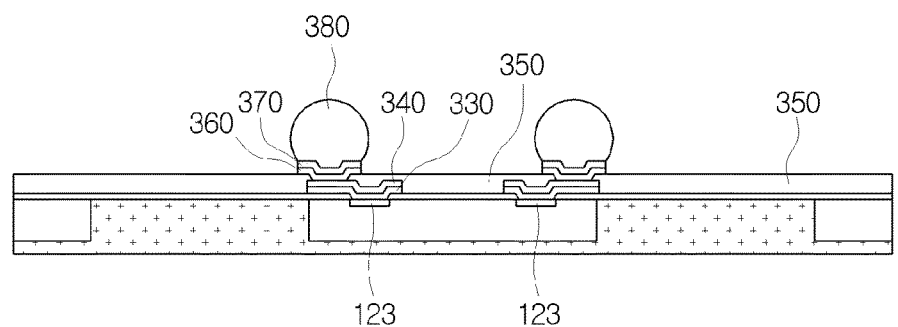

Subsequently, referring to FIG. 7D, a process of forming a first passivation layer (or an insulation layer) 320 on the EMC 310 which is upward exposed by removing the die attach film 123 and forming an opening region in the first passivation layer 320 to upward expose a bonding pad of each of the semiconductor dies 120 may be performed. A method of forming the opening region may use a photolithography process.

Subsequently, referring to FIG. 7D, a process of sequentially forming a metal seed layer 330, an RDL 340, an UBM seed layer 360, an UBM layer 370, and a solder ball 380 on the bonding pad which is upward exposed by the opening region of the first passivation layer 320 may be performed. The process of forming the metal seed layer 330, the RDL 340, the UBM seed layer 360, the UBM layer 370, and the solder ball 380 on the bonding pad may be the same as the description of FIGS. 6C to 6O, and thus, its description is not repeated.

Figure 7E:
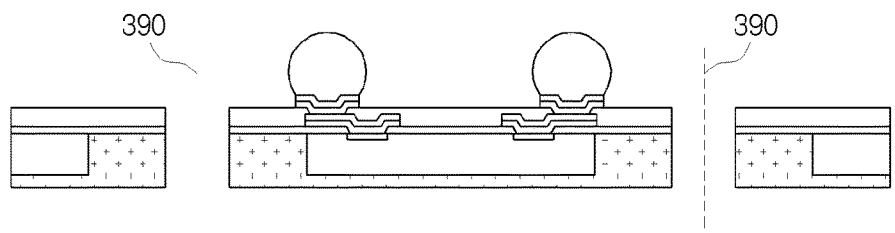

Subsequently, referring to FIG. 7E, a singulation process of isolating the finished wafer level package into a plurality of semiconductor packages along a dicing line 390 may be performed.

As described above, according to the embodiments of the present invention, in the fan-out WLP process, since a fiducial mark pattern used as a reference position for attaching a plurality of semiconductor dies to a frame is formed for attaching the semiconductor dies to accurate positions of the frame, a bumping yield is enhanced in a process of forming a metal seed layer, an RDL, a UBM seed layer, a UBM layer, and a solder ball.

According to the embodiments of the present invention, in the die attach process of the fan-out WLP process, in order to attach a plurality of semiconductor dies to accurate positions of a frame, a fiducial mark pattern may be formed in the frame, and the semiconductor dies may be attached to the accurate positions of the frame by using the fiducial mark pattern, thereby precisely arranging semiconductor dies reconstituted on the frame. Accordingly, a bumping yield is improved in a bumping process performed as a subsequent process.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a fan-out wafer level package, the method comprising:
   forming a first fiducial mark pattern on a frame;
   attaching a semiconductor die to the frame with respect to the first fiducial mark pattern;
   encapsulating the semiconductor die and the first fiducial mark pattern with a first passivation layer, for reconstituting the semiconductor die as a wafer level; and
   forming a redistribution layer using a metal seed layer as a seed, on a bonding pad of the semiconductor die upwardly exposed by an opening of the first passivation layer;
   forming a second passivation layer on the first passivation layer encapsulating the semiconductor die and the first fiducial mark pattern, and the redistribution layer;
   sequentially forming an under bump metal (UBM) seed layer, an UBM layer, and a solder ball in an opening region of the second passivation layer through which a portion of the redistribution layer is exposed,
   wherein the forming of the first fiducial mark pattern on the frame comprises:

forming the metal seed layer all over the frame;
forming a photoresist all over the metal seed layer;
forming an opening in the photoresist in a photolithography process;
filling a top metal pattern into the opening by using the metal seed layer as a seed in a plating process;
removing the photoresist including the opening; and
forming a bottom metal pattern from the metal seed layer by using the top metal pattern as an etch stop layer to form the first fiducial mark pattern including a structure where the bottom metal pattern and the top metal pattern are stacked.

2. The method of claim 1, further comprising:
isolating a semiconductor package from the fan-out wafer level package in a singulation process, the semiconductor package including the frame where the first fiducial mark pattern is formed, the semiconductor die, the metal seed layer, the redistribution layer, the UBM seed layer, the UBM layer, and the solder ball.

3. The method of claim 1, further comprising:
forming a second fiducial mark pattern, adjacent to the first fiducial mark pattern, on a frame,
wherein after the attaching of the semiconductor die to the frame, the semiconductor die is non-overlapped with the first fiducial mark pattern and the second fiducial mark pattern and
wherein the semiconductor die is disposed between the first fiducial mark pattern and the second fiducial mark pattern.

\* \* \* \* \*